(12) United States Patent
Won

(10) Patent No.: US 9,455,003 B2
(45) Date of Patent: Sep. 27, 2016

(54) DRIVER AND SEMICONDUCTOR MEMORY DEVICE INCLUDING THE SAME

(71) Applicant: SK hynix Inc., Gyeonggi-do (KR)

(72) Inventor: Hyung-Sik Won, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/308,449

(22) Filed: Jun. 18, 2014

(65) Prior Publication Data

US 2015/0228316 A1 Aug. 13, 2015

(30) Foreign Application Priority Data

Feb. 7, 2014 (KR) .................. 10-2014-0014099

(51) Int. Cl.
*G11C 7/10* (2006.01)
*G11C 7/12* (2006.01)

(52) U.S. Cl.
CPC .............. *G11C 7/12* (2013.01); *G11C 7/1048* (2013.01); *G11C 7/1096* (2013.01)

(58) Field of Classification Search
CPC ... G11C 8/08; G11C 11/4085; G11C 7/1096; G11C 7/12; G11C 11/4096
See application file for complete search history.

(56) References Cited

U.S. PATENT DOCUMENTS

| | | | |
|---|---|---|---|
| 2007/0002653 A1* | 1/2007 | Jung et al. | 365/203 |
| 2007/0280018 A1* | 12/2007 | Lee et al. | 365/203 |
| 2008/0225610 A1* | 9/2008 | Kang | 365/189.11 |
| 2013/0322195 A1* | 12/2013 | Kim | 365/203 |

FOREIGN PATENT DOCUMENTS

KR 1019980006905 3/1998

* cited by examiner

*Primary Examiner* — Khamdan Alrobaie
(74) *Attorney, Agent, or Firm* — IP & T Group LLP

(57) ABSTRACT

A driver includes a driving block suitable for driving a data transferred through a first signal line to a second signal line, a first precharge unit suitable for precharging the second signal line with a first driving power during a first precharge operation; and a second precharge unit suitable for precharging the second signal line with a second driving power which is different from the first driving power during a second precharge operation performed subsequent to the first precharge operation.

15 Claims, 5 Drawing Sheets

DRIVER AND SEMICONDUCTOR MEMORY DEVICE INCLUDING THE SAME

CROSS-REFERENCE TO RELATED APPLICATIONS

The present application claims priority of Korean Patent Application No. 10-2014-0014099, filed on Feb. 7, 2014, which is incorporated herein by reference in its entirety.

BACKGROUND

1. Field

Exemplary embodiments of the present invention relate to a semiconductor design technology, and more particularly, to a semiconductor memory device including a driver.

2. Description of the Related Art

A semiconductor memory device generally has a hierarchical line structure. In other words, memory cells are coupled with bit lines (BL), and the bit lines (BL) are coupled with local input/output (LIO) lines, and the local input/output (LIO) lines are coupled with global input/output (GIO) lines. These lines have to be developed to transfer data based on a read or write command and to be precharged before the next read or write command is applied.

The current that is consumed during read/write operations of the semiconductor memory device is defined in the specification named IDD4. The increase in the current consumed in the read/write operations may cause power noise and unwanted effects in the semiconductor memory device.

Therefore, a non-precharge scheme where the input/output lines are not precharged is used to reduce such current in a Dynamic Random Access Memory (DRAM) device. In this case, a precharge operation is not performed during a write operation section, and the local input/output (LIO) lines are precharged in order to perform another command operation after the write operation is completed. As a result, the voltage or current level of the internal data lines changes drastically in a short amount of time resulting in potential damage and decreased stability.

SUMMARY

Exemplary embodiments of the present invention are directed to a semiconductor memory device capable of performing stable precharge operations of data signal lines during read/write operations.

In accordance with an embodiment of the present invention, a driver includes a driving block suitable for driving a data transferred through a first signal line to a second signal line, a first precharge unit suitable for precharging the second signal line with a first driving power during a first precharge operation, and a second precharge unit suitable for precharging the second signal line with a second driving power which is different from the first driving power during a second precharge operation performed subsequent to the first precharge operation.

In accordance with another embodiment of the present invention, a driver includes a driving block suitable for performing a command operation on a signal line, a first precharge unit suitable for precharging the second signal line with a first driving power while the driving block performs successive command operations, and a second precharge unit suitable for precharging the signal line with a second driving power which is different from the first driving power after the driving block performs the last command operation among the successive command operations.

In accordance with another embodiment of the present invention, a semiconductor memory device includes a memory cell array including a plurality of memory cells, and a write driver suitable for writing a data in the memory cell array, wherein the write driver includes a driving block suitable for driving the data transferred through a first signal line to a second signal line, and a precharge block suitable for precharging the second signal line with a first driving power during a first precharge operation and precharging the second signal line with a second driving power different from the first driving power during a second precharge operation performed subsequent to the first precharge operation.

DETAILED DESCRIPTION

Hereafter, exemplary embodiments of the present invention will be described below in more detail with reference to the accompanying drawings. These embodiments are provided so that this disclosure will be thorough and complete, and will fully convey the scope of the present invention to those skilled in the art.

Figure 1:
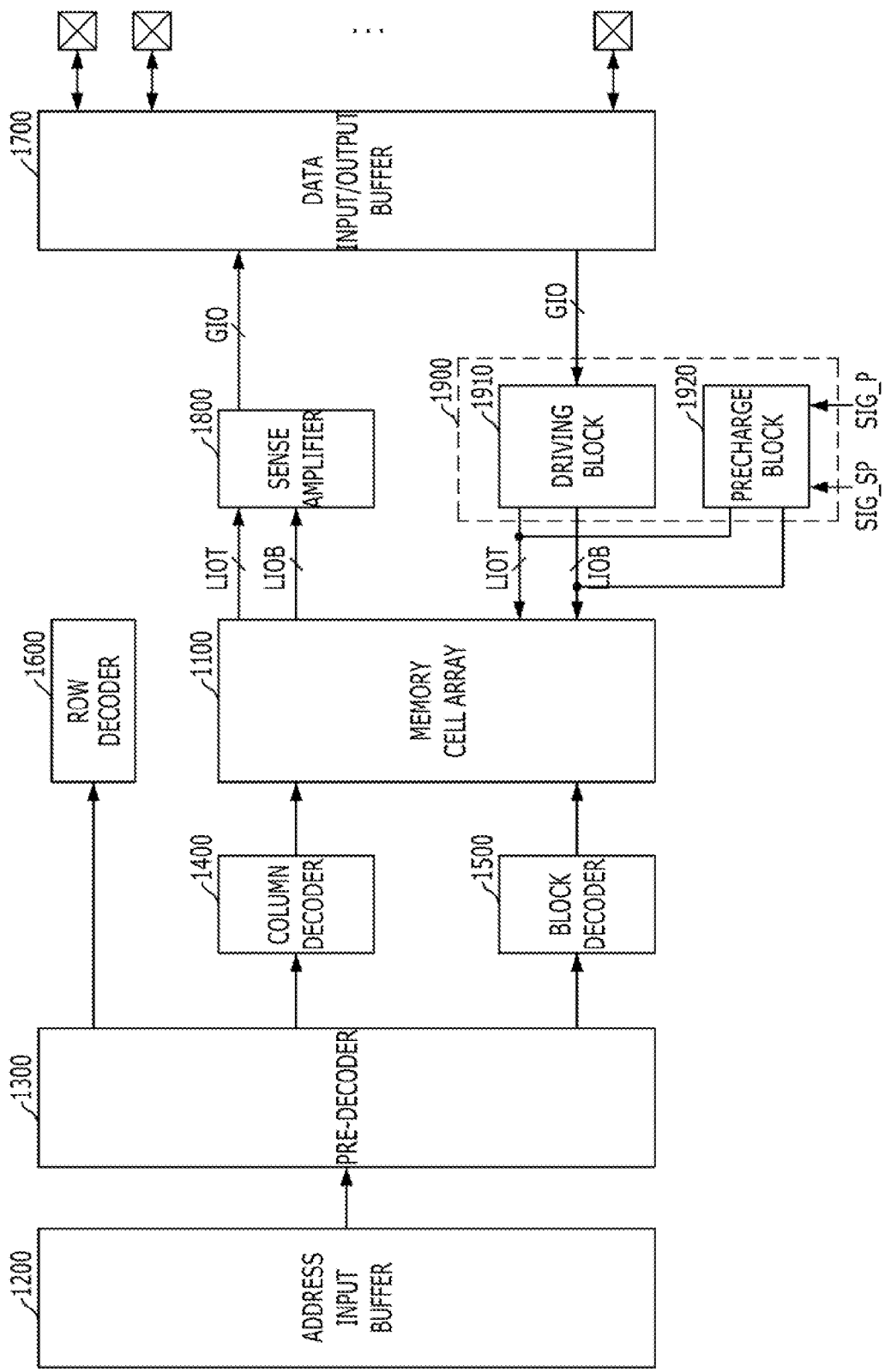
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, semiconductor memory device may include a memory cell array 1100, an address input buffer 1200, a pre-decoder 1300, a column decoder 1400, a block decoder 1500, a row decoder 1600, a data input/output buffer 1700, a sense amplifier 1800, and a write driver 1900.

A plurality of memory cells are coupled between a word line and a bit line in the memory cell array 1100.

An external address is inputted to the address input buffer 1200 and transformed to an internal address. The pre-decoder 1300 primarily decodes the internal address and transfers the primarily decoded address to the column decoder 1400, the block decoder 1500 and the row decoder 1600. The column decoder 1400 selects a target, word line of the memory cell array 1100 based on a pre-decoding result. The block decoder 1500 selects a target block of the memory cell array 1100 based on the pre-decoding result.

Similarly, the row decoder 1600 selects a target bit line of the memory cell array 1100 based on the pre-decoding result.

A plurality of data input/output pads (DQ pads) are coupled with the data input/output buffer 1700.

During a data read operation, a data is read from a selected memory cell of the memory cell array 1100 under the control of an external device and the read data is amplified in the sense amplifier 1800 and outputted to the DQ pad through the data input/output buffer 1700. During a data write operation, a data which is inputted from the DQ pad under the control of an external device is transferred to the write driver 1900 through the data input/output buffer 1700 and is transferred to a selected memory cell from the write driver 1900. The external device may be a memory controller.

The write driver 1900 may include a driving block 1910 and a precharge block 1920.

The driving block 1910 drives a data transferred through a first signal line GIO to second signal lines LIOT and LIOB. The first signal line GIO is a global input/output line GIO, and the second signal lines LIOT and LIOB are a pair of local input/output lines LIOT and LIOB. For a simple description, the first signal line GIO and the second signal lines LIOT and LIOB are indicated below as the global input/output line GIO and the local input/output lines LIOT and LIOB, respectively.

The precharge block 1920 precharges the local input/output lines LIOT and LIOB with a first driving power during an initial section of a precharge operation and with a second driving power which is different from the first driving power during the precharge operation subsequent to the initial section. The precharge block 1920 performs the precharge operation based on controls of precharge control signals SIG_SP and SIG_P. The precharge control signals SIG_SP and SIG_P include a first control signal SIG_SP and a second control signal SIG_P. The first control signal SIG_SP is a signal for controlling a moment when the precharge operation is performed with the first driving power, and the second control signal SIG_P is a signal for controlling a moment when the precharge operation is performed with the second driving power.

The operation and structure of the precharge block 1920 are described in detail with reference to the accompanying FIG. 2.

Figure 2:
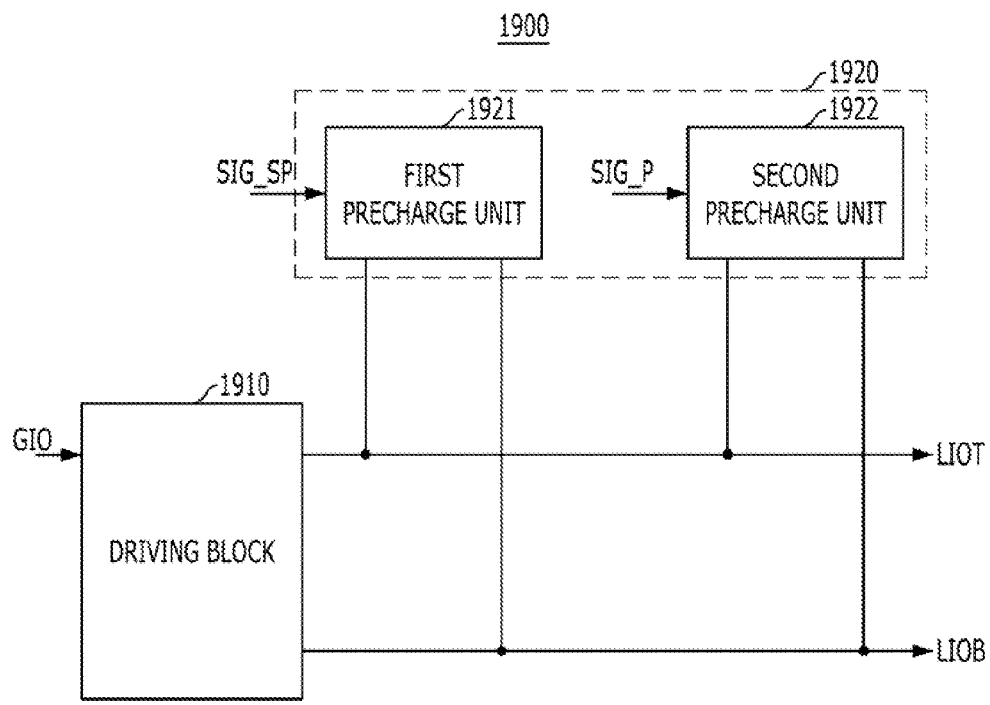
FIG. 2 is a block diagram illustrating in detail a write driver among the components of the semiconductor memory device in accordance with the embodiment of the present invention shown in FIG. 1.

FIG. 2 is a block diagram illustrating in detail the write driver 1900 among the components of the semiconductor memory device in accordance with the embodiment of the present invention shown in FIG. 1.

Referring to FIG. 2, the write driver 1900 may include the driving block 1910 and the precharge block 1920.

The driving block 1910 drives a data transferred through the global input/output line GIO to the local input/output lines LIOT and LIOB.

The precharge block 1920 includes a first precharge unit 1921 and a second precharge unit 1922. The first precharge unit 1921 precharges the local input/output lines LIOT and LIOB with a first driving power in response to the first control signal SIG_SP. The second precharge unit 1922 precharges the local input/output lines LIOT and LIOB with a second driving power in response to the second control signal SIG_P.

In this embodiment the first driving power has a smaller value than the second driving power. Therefore, when the precharge operation is performed in response to the first control signal SIG_SP, the local input/output lines LIOT and LIOB are precharged with a relatively weak driving power, and when the precharge operation is performed in response to the second control signal SIG_P, the local input/output lines LIOT and LIOB are precharged with a relatively large driving power.

The first and second control signals SIG_SP and SIG_P may be inputted from an external device or generated inside a memory. The external device may be a memory controller.

Figure 3:
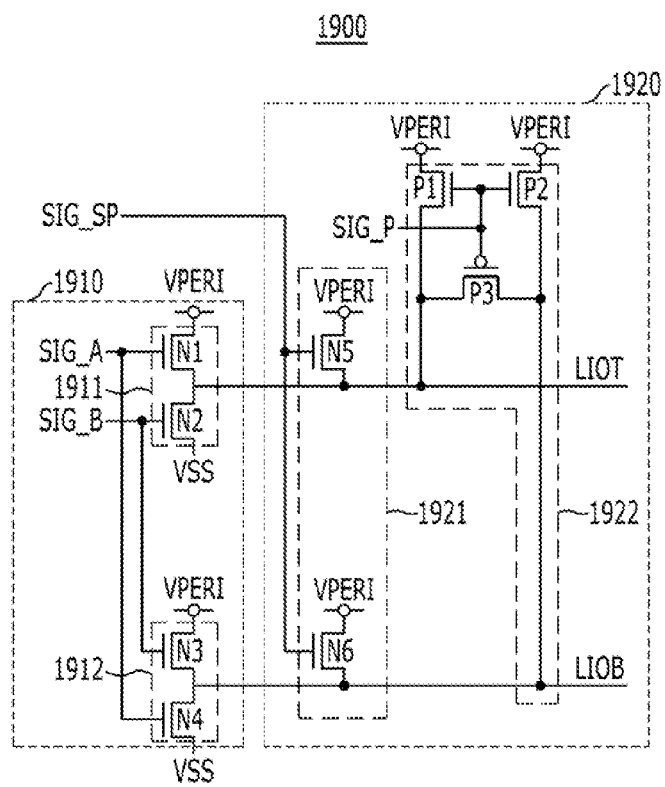
FIG. 3 is a circuit diagram illustrating in detail the write driver in accordance with the embodiment of the present invention shown in FIG. 2.

FIG. 3 is a circuit diagram illustrating in detail the write driver 1900 in accordance with the embodiment of the present invention shown in FIG. 2.

Referring to FIG. 3, the write driver 1900 includes the driving block 1910 and the precharge block 1920.

The driving block 1910 includes a first driving unit 1911 and a second driving unit 1912.

The first driving unit 1911 pulls up the local input/output line LIOT with a peripheral voltage VPERI or pulls down the local input/output line LIOT with a ground voltage VSS in response to first and second data signals SIG_A and SIG_B. The second driving unit 1912 pulls up the local input/output line LIOB with the peripheral voltage VPERI or pull's down the local input/output line LIOB with the ground voltage VSS in response to the first and second data signals SIG_A and SIG_B. The first and second data signals SIG_A and SIG_B have complementary values to each other, which are inputted from the global input/output line GIO. For example, when the first data signal SIG_A has a logic high value (hereafter, referred to as 'H'), the second data signal SIG_B has a logic low value (hereafter, referred to as 'L').

When the first data signal SIG_A has H, the local input/output line LIOT may be driven to be pulled-up with the peripheral voltage VPERI, and the local input/output line LIOB may be driven to be pulled-down with the ground voltage VSS.

As the peripheral voltage VPERI is generated by down-converting an external power supply voltage which is applied, it may be lower than the external power supply voltage by a predetermined level.

The precharge block 1920 includes the first precharge unit 1921 and the second precharge unit 1922.

The first precharge unit 1921 is formed of NMOS transistors N5 and N6 for precharging the local input/output lines LIOT and LIOB respectively with the first driving power in response to the first control signal SIG_SP. The NMOS transistor N5 precharges the local input/output line LIOT with a voltage VPERI-Vt obtained by subtracting a threshold voltage Vt from the peripheral voltage VPERI in response to the first control signal SIG_SP. The NMOS transistor N6 precharges the local input/output line LIOB with the voltage VPERI-Vt in response to the first control signal SIG_SP. The NMOS transistors N5 and N6 having the first driving power that secures a minimum precharge level may be bleeder transistors.

The second precharge unit 1922 is formed of PMOS transistors P1, P2 and P3 for precharging the local input/output lines LIOT and LIOB with the second driving power in response to the second control signal SIG_P. The two PMOS transistors P1 and P2 precharge the local input/output lines LIOT and LIOB respectively with the peripheral voltage VPERI, and the other PMOS transistor P3 equalizes a pair of the local input/output lines LIOT and LIOB. Therefore, the local input/output lines LIOT and LIOB are equalized on the same voltage level and precharged with the peripheral voltage VPERI. The PMOS transistors P1 and P2 have a larger driving power than the NMOS transistors N5 and N6. The local input/output lines LIOT and LIOB may be completely precharged with the peripheral voltage VPERI while the second control signal SIG_P is enabled at the moment when a write operation is completed.

Figure 4A:
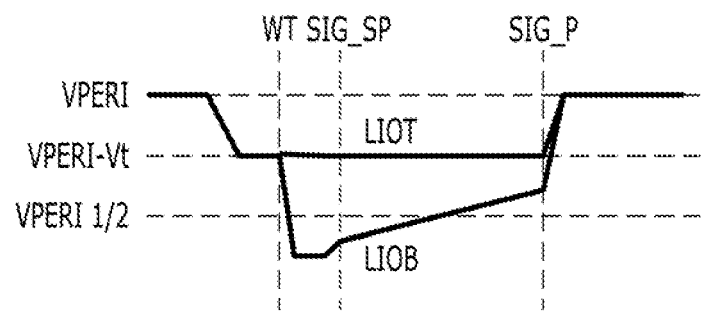
FIGS. 4A to 4C are timing diagrams illustrating an operation of the write driver in accordance with the embodiment of the present invention shown in FIG. 3.
Figure 4B:
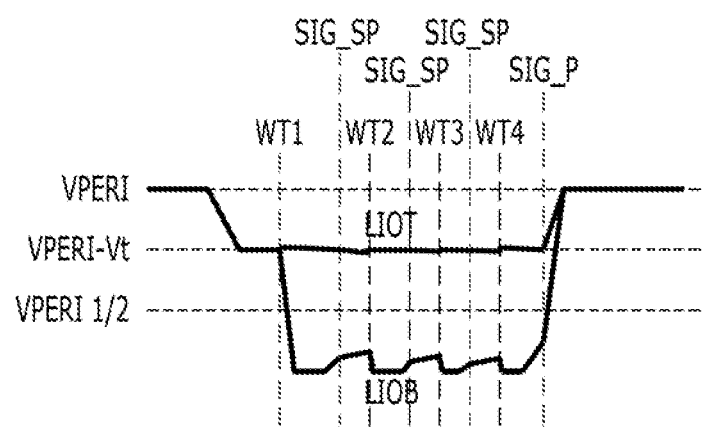
Figure 4C:
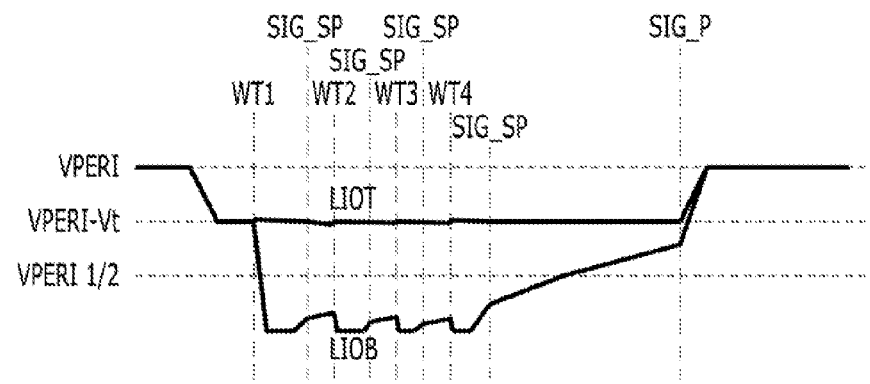

FIGS. 4A to 4C are timing diagrams illustrating an operation of the write driver 1900 in accordance with the embodiment of the present invention shown in FIG. 3.

FIG. 4A is a timing diagram illustrating a precharge operation of the local input/output lines LIOT and LIOB when a write operation is performed just once.

Referring to FIGS. 3 and 4A, a pair of the local input/output lines LIOT and LIOB performs a write operation with complementary values, respectively, in response to a write command WT. After the write operation is performed, the local input/output lines LIOT and LIOB are precharged weakly with a voltage VPERI-Vt obtained by subtracting a threshold voltage Vt from the peripheral voltage VPERI by the NMOS transistors N5 and N6 having the first driving power in response to the first control signal SIG_SP during an initial section of the precharge operation. Subsequently, the local input/output lines LIOT and LIOB are precharged with the peripheral voltage VPERI at once in response to the second control signal SIG_P in order to perform another command operation.

FIG. 4B is a timing diagram illustrating a precharge operation of the local input/output lines LIOT and LIOB during a section where successive write operations are performed.

Referring to FIGS. 3 and 4B, the local input/output lines LIOT and LIOB perform write operations with complementary values, respectively, in response to successive write commands WT1 to WT4. The local input/output lines LIOT and LIOB are precharged weakly with a voltage VPERI-Vt obtained by subtracting a threshold voltage Vt from the peripheral voltage VPERI by the NMOS transistors N5 and N6 having the first driving power in response to the first control signal SIG_SP in between the successive write operations. After the local input/output lines LIOT and LIOB perform the write operation in response to the last write command WT4, that is, when the write operations are completed, the local input/output lines LIOT and LIOB are precharged with the peripheral voltage VPERI in response to the second control signal SIG_P in order to perform another command operation.

In other words, the local input/output lines LIOT and LIOB are precharged weakly with a voltage VPERI-Vt obtained by subtracting a threshold voltage Vt from the peripheral voltage VPERI based on the first driving power for the next write operation after every write operation of the successive write operation sections. The local input/output lines LIOT and LIOB are completely precharged with the peripheral voltage VPERI based on the second driving power after the last write operation is completed.

FIG. 4C is a timing diagram illustrating another precharge operation of the local input/output lines LIOT and LIOB during a section where successive write operations are performed as shown in FIG. 4B.

In FIG. 4B, after the last write operation is completed, the local input/output lines LIOT and LIOB are completely precharged with the peripheral voltage VPERI based on the second driving power. In FIG. 4C, after the last write operation is completed, the local input/output lines LIOT and LIOB are precharged weakly with a voltage VPERI-Vt obtained by subtracting a threshold voltage Vt from the peripheral voltage VPERI based on the first driving power, and then the local input/output lines LIOT and LIOB are completely precharged with the peripheral voltage VPERI based on the second driving power.

As described above, when the semiconductor memory device precharges the local input/output lines LIOT and LIOB, the precharge operation is not performed at once. That is, the precharge operation is performed with a weak driving power first, and then with a strong driving power. Therefore, current is not consumed all at once so that stability of internal data lines may be secured.

Also, as the local input/output lines LIOT and LIOB are precharged with a weak driving power between the successive write operations, the stability of the local input/output lines LIOT and LIOB may be secured. In other words, the stability of peripheral circuits including the local input/output lines LIOT and LIOB may be secured when another command operation enters after the write operations are completed.

In FIG. 3, a pair of the local input/output lines LIOT and LIOB is precharged weakly in response to the first control signal SIG_SP and is not equalized. Therefore, voltage levels of the local input/output lines LIOT and LIOB are differently precharged. This may be seen in FIGS. 4A to 4C.

Figure 5:
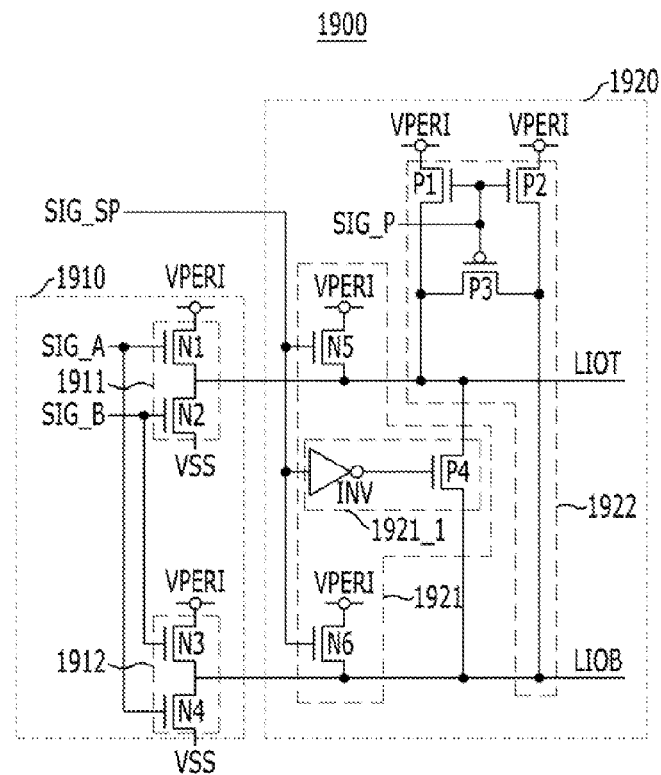
FIG. 5 is a circuit diagram illustrating in detail the write driver in accordance with another embodiment of the present invention shown in FIG. 2.

FIG. 5 is a circuit diagram illustrating a first precharge unit 1921 including an equalization part in accordance with another embodiment of the present invention.

Referring to FIG. 5, the write driver 1900 includes a driving block 1910 and a precharge block 1920.

The components and operations of the driving block 1910 shown in FIG. 5 correspond to those of the driving block 1910 shown in FIG. 3.

The precharge block 1920 includes a first precharge unit 1921 and a second precharge unit 1922.

Since the components and operations of the second precharge unit 1922 shown in FIG. 5 correspond to those of the second precharge unit 1922 shown in FIG. 3, a description just of the first precharge unit 1921 is provided hereafter.

The first precharge unit 1921 may further include an equalization part 1921_1 having inverter INV and a PMOS transistor P4.

The equalization part 1921_1 equalizes voltage levels of local input/output lines LIOT and LIOB to half of the peripheral voltage VPERI/2 in response to a first control signal SIG_SP.

Figure 6:
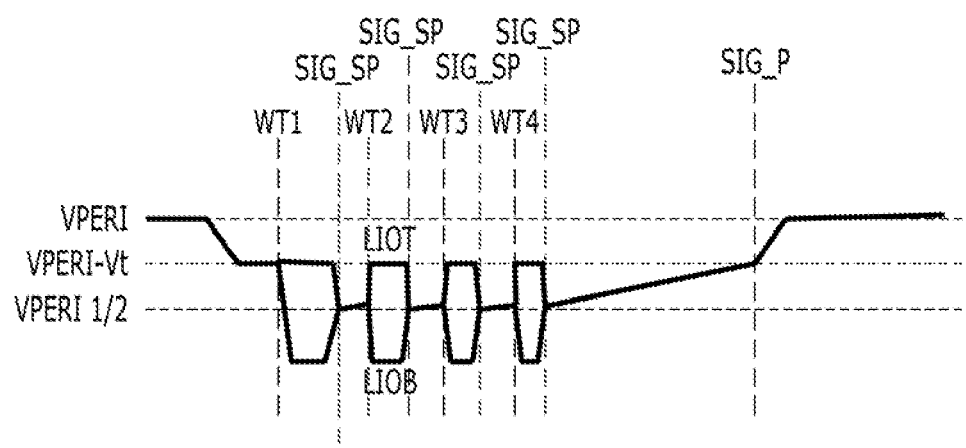
FIG. 6 is a timing diagram illustrating an operation of the write driver in accordance with another embodiment of the present invention shown in FIG. 5.

FIG. 6 is a timing diagram illustrating an operation of the write driver 1900 in accordance with another embodiment of the present invention shown in FIG. 5.

Referring to FIGS. 5 and 6, the local input/output lines LIOT and LIOB are equalized to half of the peripheral voltage VPERI/2 by the equalization part 1921_1 and precharged between write operations.

Therefore, since the precharge operations are performed as the same voltage level is applied even before the local input/output lines LIOT and LIOB perform the precharge operations on the same level in response to the second control signal SIG_P, the voltage levels of the local input/output lines LIOT and LIOB are equally changed.

While the present invention has been described with respect to specific embodiments, it is noted that the embodiments of the present invention are not restrictive but descriptive. Further, it is noted that the present invention may be achieved in various ways through substitution, change, and modification by those skilled in the art without departing from the scope of the present invention as defined by the following claims.

For example, although it is described that the NMOS transistors are formed in the first precharge unit 1921, and the PMOS transistors are formed in the second precharge unit 1922 in the embodiments of the present invention, the present invention is also applies where different types of transistors are used. Also, dispositions and types of the transistors described in the aforementioned embodiments may be implemented differently based on the polarity of the inputted signal.

Further, although a write driver which performs a precharge operation after a write operation is performed is described as an example in the embodiments, the present invention may be applied where the precharge operation is performed after a read operation is performed.

In accordance with the embodiments of the present invention, as a data signal line is precharged with a weak driving power during an initial section of a precharge operation after read/write operations are performed, the stability of the data signal line may be secured when another command operation enters.

Also, as the data signal line is precharged with the weak driving power between the successive read/write operations, stability of the data signal line may be secured.

What is claimed is:

1. A driver, comprising:
   a driving block suitable for driving a data transferred through a first signal line to a second signal line;
   a first precharge unit suitable for precharging the second signal line with a first driving power during a first section of a precharge operation; and
   a second precharge unit suitable for precharging the second signal line with a second driving power which is different from the first driving power during a second section of the precharge operation subsequent to the first section of the precharge operation,
   wherein the first driving power has a smaller value than the second driving power, and
   wherein the first section of the precharge operation is performed after the driving block drives each data of successive data transferred through the first signal line to the second signal line, and the second section of the precharge operation is performed after the driving block drives the last data of the successive data transferred through the first signal line to the second signal line.

2. The driver of claim 1, wherein the precharge operation including the first and second sections are performed after the driving block drives a single data transferred through the first signal line to the second signal line.

3. The driver of claim 1, wherein the first and second signal lines are a pair of differential signal lines.

4. The driver of claim 3, wherein the first precharge unit includes an equalization part suitable for equalizing the second signal line during the first precharge operation.

5. A driver, comprising:
   a driving block suitable for performing a command operation on a signal line;
   a first precharge unit suitable for precharging the signal line with a first driving power between successive command operations; and
   a second precharge unit suitable for precharging the signal line with a second driving power which is different from the first driving power after the driving block performs the last command operation among the successive command operations,
   wherein the first precharge unit precharges the signal line with the first driving power during a first section of a precharge operation, and the second precharge unit precharges the signal line with the second driving power which is different from the first driving power during a second section of the precharge operation subsequent to the first section of the precharge operation,
   wherein the first driving power has a smaller value than the second driving power.

6. The driver of claim 5, further comprising:
   a third precharge unit suitable for precharging the signal line with the first driving power before the signal line is precharged with the second driving power after the last command operation is performed.

7. The driver of claim 6, wherein the signal lines are a pair of differential signal lines.

8. The driver of claim 7, wherein the first and third precharge units include an equalization part suitable for equalizing the signal line.

9. The driver of claim 5, wherein the command operation is a read command operation or a write command operation.

10. A semiconductor memory device, comprising:
    a memory cell array including a plurality of memory cells; and
    a write driver suitable for writing a data in the memory cell array,
    wherein the write driver includes:
    a driving block suitable for driving the data transferred through a first signal line to a second signal line; and
    a precharge block suitable for precharging the second signal line with a first driving power during a first section of a precharge operation and precharging the second signal line with a second driving power different from the first driving power during a second section of the precharge operation subsequent to the first section of the precharge operation,
    wherein the first driving power has a smaller value than the second driving power,
    wherein the first section of the precharge operation is performed after the driving block drives each data of successive data transferred through the first signal line to the second signal line, and the second section of the precharge operation is performed after the driving block drives the last data of the successive data transferred through the first signal line to the second signal line.

11. The semiconductor memory device of claim 10, wherein the precharge block includes:
    a first precharge unit suitable for precharging the second signal line with the first driving power during the first section of the precharge operation; and
    a second precharge unit suitable for precharging the second signal line with the second driving power during the second section of the precharge operation.

12. The semiconductor memory device of claim 11, wherein the first and second signal lines are a pair of differential signal lines.

13. The semiconductor memory device of claim 12, wherein the first precharge unit includes an equalization part for equalizing the second signal line during the first precharge operation.

14. The semiconductor memory device of claim 10, wherein the first signal line is a global input/output line, and the second signal line is a local input/output line.

15. The semiconductor memory device of claim 10, wherein the precharge operation including the first and second sections are performed after the driving block drives a single data transferred through the first signal line to the second signal line.

* * * * *